United States Patent
Oh et al.

(10) Patent No.: US 9,293,614 B2
(45) Date of Patent: Mar. 22, 2016

(54) SOLAR CELL

(75) Inventors: Min-Seok Oh, Yongin-si (KR); Doo-Youl Lee, Yongin-si (KR); Young-Jin Kim, Yongin-si (KR); Min Park, Yongin-si (KR); Yun-Seok Lee, Yongin-si (KR); Nam-Kyu Song, Yongin-si (KR); Dong-Seop Kim, Yongin-si (KR); Cho-Young Lee, Yongin-si (KR); Chan-Bin Mo, Yongin-si (KR); Young-Su Kim, Yongin-si (KR); Hoon-Ha Jeon, Yongin-si (KR); Yeon-Ik Jang, Yongin-si (KR); Jun-Ki Hong, Yongin-si (KR); Young-Sang Park, Yongin-si (KR); Chan-Yoon Jung, Yongin-si (KR)

(73) Assignee: Intellectual Keystone Technology LLC, McLean, VA (US)

( * ) Notice: Subject to any disclaimer, the term of this patent is extended or adjusted under 35 U.S.C. 154(b) by 394 days.

(21) Appl. No.: 13/565,828

(22) Filed: Aug. 3, 2012

(65) Prior Publication Data

US 2013/0112253 A1    May 9, 2013

(30) Foreign Application Priority Data

Nov. 8, 2011  (KR) .................. 10-2011-0115943

(51) Int. Cl.
*H01L 31/0224*  (2006.01)
*H01L 31/0352*  (2006.01)
*H01L 31/05*  (2014.01)
(Continued)

(52) U.S. Cl.
CPC ...... *H01L 31/03529* (2013.01); *H01L 31/0224* (2013.01); *H01L 31/022408* (2013.01); *H01L 31/022425* (2013.01); *H01L 31/022441* (2013.01); *H01L 31/0516* (2013.01);
(Continued)

(58) Field of Classification Search
CPC ................. H01L 31/0224; H01L 31/022441; H01L 31/022425; H01L 31/022408; H01L 31/0682; H01L 31/0516; H01L 31/03529; H01L 31/0747
USPC ......................................................... 136/256
See application file for complete search history.

(56) References Cited

U.S. PATENT DOCUMENTS 7,368,797 B2    5/2008    Nagashima et al.
7,727,866 B2    6/2010    Bateman et al.
(Continued)

FOREIGN PATENT DOCUMENTS

KR    10-2009-0101395 A    9/2009
KR    10-2010-0128726 A    12/2010
(Continued)

*Primary Examiner* — Devina Pillay
(74) *Attorney, Agent, or Firm* — Sherr & Partners, PLLC

(57) ABSTRACT

A solar cell including a first conductive type semiconductor substrate; a first intrinsic semiconductor layer on a front surface of the semiconductor substrate; a first conductive type first semiconductor layer on at least one surface of the first intrinsic semiconductor layer; a second conductive type second semiconductor layer on a back surface of the semiconductor substrate; a second intrinsic semiconductor layer between the second semiconductor layer and the semiconductor substrate; a first conductive type third semiconductor layer on the back surface of the semiconductor substrate, the third semiconductor layer being spaced apart from the second semiconductor layer; and a third intrinsic semiconductor layer between the third semiconductor layer and the semiconductor substrate.

20 Claims, 9 Drawing Sheets

(51) Int. Cl.
*H01L 31/068* (2012.01)
*H01L 31/0747* (2012.01)

(52) U.S. Cl.
CPC ........ *H01L31/0682* (2013.01); *H01L 31/0747* (2013.01); *Y02E 10/547* (2013.01)

(56) References Cited

U.S. PATENT DOCUMENTS

| | | |
|---|---|---|
| 7,741,225 B2 | 6/2010 | Rohatgi et al. |
| 2005/0062041 A1 | 3/2005 | Terakawa et al. |
| 2007/0169808 A1 | 7/2007 | Kherani et al. |
| 2007/0256728 A1 | 11/2007 | Cousins |
| 2008/0000522 A1 | 1/2008 | Johnson et al. |
| 2010/0087031 A1 | 4/2010 | Veschetti et al. |
| 2010/0139764 A1 | 6/2010 | Smith |
| 2010/0236613 A1 | 9/2010 | Lee et al. |
| 2010/0263725 A1 | 10/2010 | Schmidt |
| 2010/0319769 A1 | 12/2010 | Birkmire et al. |
| 2011/0000532 A1* | 1/2011 | Niira et al. .................... 136/255 |
| 2011/0003423 A1 | 1/2011 | Smith |
| 2011/0041911 A1* | 2/2011 | Lee et al. ...................... 136/256 |
| 2011/0056545 A1* | 3/2011 | Ji et al. ........................ 136/255 |
| 2011/0240105 A1* | 10/2011 | Luan et al. .................... 136/255 |
| 2014/0020740 A1* | 1/2014 | Hasegawa ....... H01L 31/022441 136/255 |
| 2014/0020742 A1* | 1/2014 | Hasegawa ....... H01L 31/022441 136/255 |

FOREIGN PATENT DOCUMENTS

| | | | |
|---|---|---|---|
| KR | 10-2010-0136462 A | 12/2010 | |
| KR | 10-2011-0008250 A | 1/2011 | |
| WO | WO2012/132758 A1 * | 4/2012 | ...... H01L 31/022441 |
| WO | WO2012/132835 A1 * | 4/2012 | ...... H01L 31/022441 |

* cited by examiner

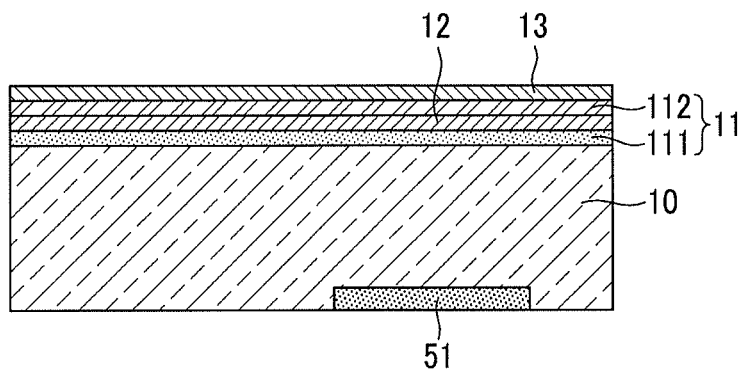
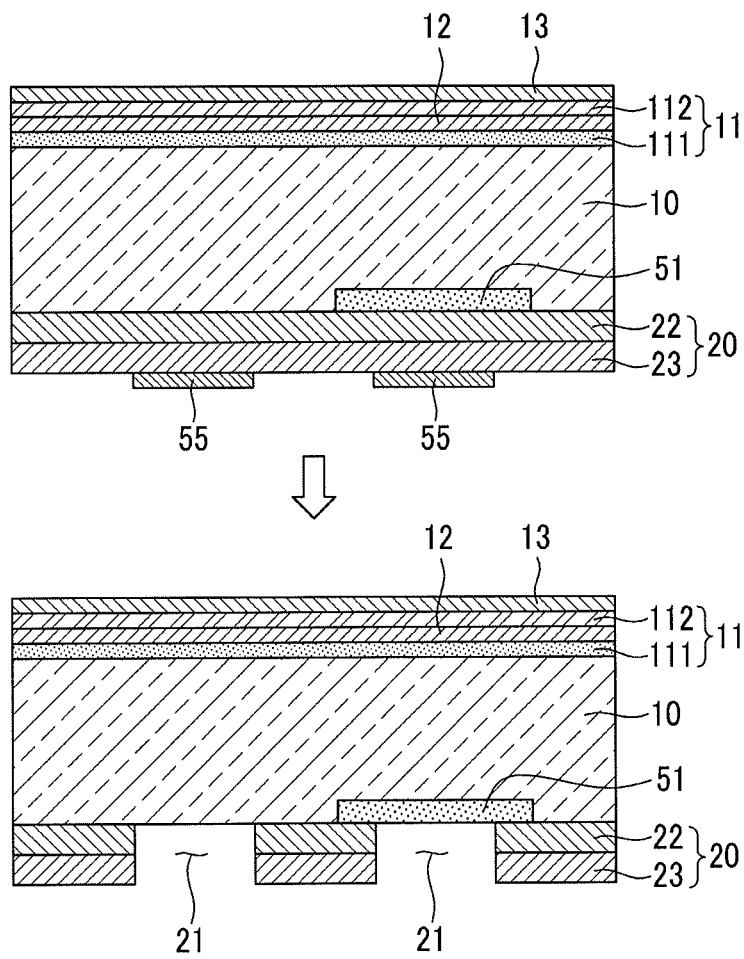

SOLAR CELL

BACKGROUND

1. Field

Embodiments relate to a solar cell.

2. Description of the Related Art

A solar cell may generate an electron-hole pair at a p-n junction in response to light and may collect holes and electrons at a cathode and an anode to supply power to external devices. A heterojunction with an intrinsic thin-layer (HIT) structure may have a structure in which an intrinsic semiconductor layer is disposed between an n type (or p type) semiconductor substrate and a p type (or n type) semiconductor so as to suppress a recombination of carriers at a p-n junction.

The above information disclosed in this Background section is only for enhancement of understanding of the background of the described technology and therefore it may contain information that does not form the prior art.

SUMMARY

Embodiments are directed to a solar cell.

The embodiments may be realized by providing a solar cell including a first conductive type semiconductor substrate; a first intrinsic semiconductor layer on a front surface of the semiconductor substrate; a first conductive type first semiconductor layer on at least one surface of the first intrinsic semiconductor layer; a second conductive type second semiconductor layer on a back surface of the semiconductor substrate; a second intrinsic semiconductor layer between the second semiconductor layer and the semiconductor substrate; a first conductive type third semiconductor layer on the back surface of the semiconductor substrate, the third semiconductor layer being spaced apart from the second semiconductor layer; and a third intrinsic semiconductor layer between the third semiconductor layer and the semiconductor substrate.

The first semiconductor layer may include a high concentration doping region between the semiconductor substrate and the first intrinsic semiconductor layer.

The first semiconductor layer may include an amorphous silicon layer on a front surface of the first intrinsic semiconductor layer.

The first semiconductor layer may include a first layer between the semiconductor substrate and the first intrinsic semiconductor layer, the first layer including a high concentration doping region, and a second layer on a front surface of the first intrinsic semiconductor layer, the second layer including an amorphous silicon layer.

The solar cell may further include an anti-reflective layer on the front surface of the semiconductor substrate, the front surface of the semiconductor substrate having a surface textured structure.

The embodiments may also be realized by providing a solar cell including a first conductive type semiconductor substrate; a first intrinsic semiconductor layer on a front surface of the semiconductor substrate; a passivation layer on a back surface of the semiconductor substrate, the passivation layer including a plurality of opening parts and having a double layer structure of a non-photo-conductive material; a second intrinsic semiconductor layer in any one of the plurality of opening parts, the second intrinsic semiconductor layer contacting a back surface of the passivation layer; a second conductive type second semiconductor layer on a back surface of the second intrinsic semiconductor layer; a third intrinsic semiconductor layer in another of the plurality of opening parts, the third intrinsic semiconductor layer contacting the back surface of the passivation layer and being spaced apart from the second intrinsic semiconductor layer; and a first conductive type third semiconductor layer on a back surface of the third intrinsic semiconductor layer.

The passivation layer may have a stacked structure including a fourth intrinsic semiconductor layer and a silicon nitride layer.

The solar cell may further include a fourth semiconductor layer on the back surface of the semiconductor substrate, the fourth semiconductor layer contacting the third intrinsic semiconductor layer and including a first conductive type doping region doped at a higher concentration than the semiconductor substrate.

The passivation layer may have a stacked layer structure including a silicon oxide layer and a silicon nitride layer.

The solar cell may further include a fourth semiconductor layer spaced apart from the second intrinsic semiconductor layer on the back surface of the semiconductor substrate, the fourth semiconductor layer contacting the third intrinsic semiconductor layer and the silicon oxide layer and including a first conductive type doping region doped at a higher concentration than the semiconductor substrate.

The second semiconductor layer may have a same size as that of the second intrinsic semiconductor layer, and the third semiconductor layer may have a same size as that of the third intrinsic semiconductor layer.

The solar cell may further include a first electrode on a back surface of the second semiconductor layer, and a second electrode on a back surface of the third semiconductor layer, wherein the first electrode and the second electrode each have a stacked layer structure including a transparent electrode layer and a metal electrode layer.

The solar cell may further include an anti-reflective layer on a front surface of the first intrinsic semiconductor layer, the front surface of the semiconductor substrate having a surface textured structure.

The embodiments may also be realized by providing a solar cell including a first conductive type semiconductor substrate; a first intrinsic semiconductor layer on a front surface of the semiconductor substrate; a first conductive type first semiconductor layer on at least one surface of the first intrinsic semiconductor layer; a passivation layer on a back surface of the semiconductor substrate, the passivation layer including a plurality of opening parts therein, having a double layer structure, and including a non-photo-conductive material; a second intrinsic semiconductor layer in any one of the plurality of opening parts, the second intrinsic semiconductor layer contacting a back surface of the passivation layer; a second conductive type second semiconductor layer on a back surface of the second intrinsic semiconductor layer; a third intrinsic semiconductor layer in another opening part of the plurality of opening parts, the third intrinsic semiconductor layer contacting the back surface of the passivation layer and being spaced apart from the second intrinsic semiconductor layer; and a first conductive type third semiconductor layer on a back surface of the third intrinsic semiconductor layer.

The first semiconductor layer may include at least one of a first layer on a back surface of the first intrinsic semiconductor layer, the first layer including a high concentration doping region, and a second layer on a front surface of the first intrinsic semiconductor layer, the second layer including an amorphous silicon layer.

The solar cell may further include an anti-reflective layer on the front surface of the semiconductor substrate, the front surface of the semiconductor substrate having a surface textured structure.

The passivation layer may include any one of a stacked layer structure of a fourth intrinsic semiconductor layer and a silicon nitride layer, and a stacked layer structure of a silicon oxide layer and a silicon nitride layer.

The solar cell may further include a fourth semiconductor layer on the back surface of the semiconductor substrate, the fourth semiconductor layer contacting the third intrinsic semiconductor layer and including a first conductive type doping region doped at a higher concentration than the semiconductor substrate.

The fourth semiconductor layer may extend on the back surface of the semiconductor substrate, may contact the silicon oxide layer, and may be spaced apart from the second intrinsic semiconductor layer.

The solar cell may further include a first electrode on the back surface of the second semiconductor layer; and a second electrode on the back surface of the third semiconductor layer, wherein the first electrode and the second electrode each have a stacked layer structure including a transparent electrode layer and a metal electrode layer.

BRIEF DESCRIPTION OF THE DRAWINGS

Features will become apparent to those of ordinary skill in the art by describing in detail exemplary embodiments with reference to the attached drawings in which:

FIGS. 6A to 6E illustrate schematic diagrams showing stages in a manufacturing process of a solar cell according to an embodiment.

DETAILED DESCRIPTION

Figure 1:
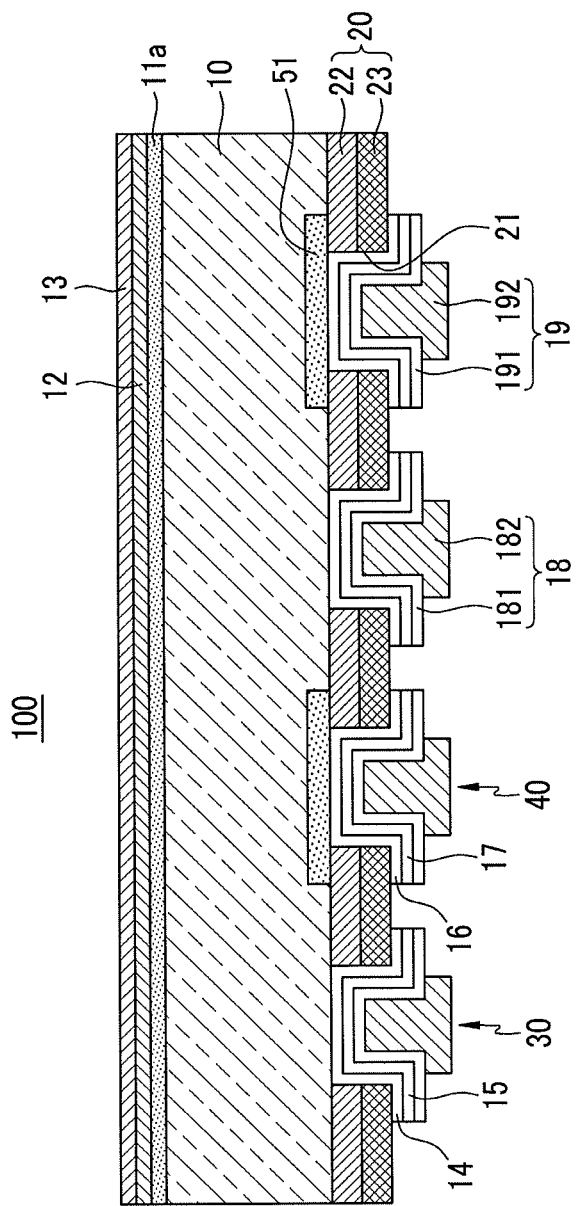
FIG. 1 illustrates a schematic diagram of a solar cell according to an embodiment.

Korean Patent Application No. 10-2011-0115943, filed on Nov. 8, 2011, in the Korean Intellectual Property Office, and entitled: "Solar Cell," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a schematic diagram of a solar cell according to an embodiment.

Referring to FIG. 1, a solar cell 100 according to the present embodiment may include a semiconductor substrate 10, a first semiconductor layer 11a on a front surface of the semiconductor substrate 10, a first intrinsic semiconductor layer 12, and an anti-reflective layer 13.

The semiconductor substrate 10 may include the front surface (e.g., a light receiving surface) to which light, e.g., sunlight, may be incident, and a back surface that is an opposite surface thereto. In the solar cell 100, e.g., a back electrode type solar cell, a structure (cathode 30) for collecting holes, and a structure (anode 40) for collecting electrodes may be formed on the back surface of the semiconductor substrate 10. The semiconductor substrate 10 may have a first conductive type and may be formed of or include, e.g., an n-type silicon wafer.

The first semiconductor layer 11a (having the same conductive type as the semiconductor substrate 10) may be formed on the front surface of the semiconductor substrate 10. The first semiconductor layer 11a may be formed of or include a high concentration n-type doping region (n+ diffusion layer) into which impurities having higher concentration than that of the semiconductor substrate 10 are implanted. The first intrinsic semiconductor layer 12 may be disposed on a front surface of the first semiconductor layer 11a and may be formed of or include amorphous silicon (in which the impurities are not intentionally doped).

The first intrinsic semiconductor layer 12, e.g., a hydrogenated amorphous silicon thin layer, may perform a surface defect passivation function that helps reduce surface defects of the semiconductor substrate 10 by combining silicon and hydrogen (included in the first intrinsic semiconductor layer 12) with a dangling bond (existing on a surface of the semiconductor substrate 10).

The first semiconductor layer 11a may serve as a front surface field layer to help reduce recombination of charges generated on the surface of the semiconductor substrate 10, thereby helps to increase an opening voltage of the solar cell 100, in conjunction with the first intrinsic semiconductor layer 12. For example, the n-type doped first semiconductor layer 11a may hinder movement of negative charges to the surface to reduce the recombination with positive charges, thereby increasing the opening voltage.

The anti-reflective layer 13 may be disposed on a front surface of the first intrinsic semiconductor layer 12. The anti-reflective layer 13 may help reduce light reflection loss on the surface of the solar cell 100 and may help increase selectivity of a specific wavelength region.

The anti-reflective layer 13 may be formed as a single layer or a multilayer. The anti-reflective layer 13 may be formed of or include, e.g., a metal oxide, a metal nitride, a metal sulfide, and/or a metal fluoride. The metal oxide, the metal nitride, the metal sulfide, and the metal fluoride that may be used for the anti-reflective layer 13 may include, e.g., at least one of $LaF_2$, $NdF_3$, $Al_2O_3$, $CoF_3$, $PbF_2$, $MgO$, $ThO_2$, $SnO_2$, $La_2O_3$, $In_2O_3$, $Nd_2O_3$, $Sb_2O_3$, $ZrO_2$, $CoO_2$, $TiO_2$, $ZnS$, and $Bi_2O_3$.

Figure 2:
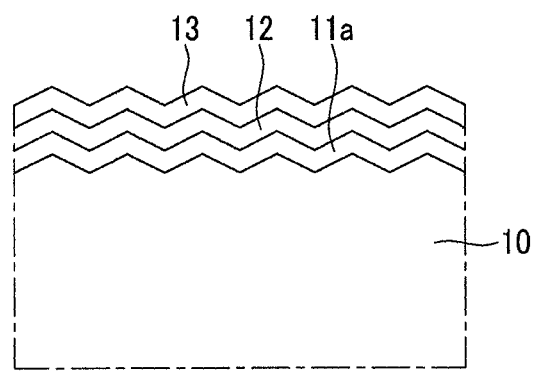
FIG. 2 illustrates a partially enlarged view of the solar cell of FIG. 1.

The front surface of the semiconductor substrate 10, the first semiconductor layer 11a, the first intrinsic semiconductor layer 12, and the anti-reflective layer 13 may have a surface textured structure. FIG. 2 illustrates a partially enlarged view of the solar cell of FIG. 1. FIG. 2 shows the front surface of the semiconductor substrate 10, the first semiconductor layer 11a, the first intrinsic semiconductor layer 12, and the anti-reflective layer 13 having the surface textured structure.

The surface textured structure refers to the surface of an object having, e.g., a pyramid or rugged structure. Thus, absorption of light, e.g., sunlight, may be increased by increasing the surface area of the front surface of the semiconductor substrate 10 to which the light is incident and the short-circuit current of the solar cell 100 may be increased by reducing the reflectivity.

The solar cell 100 according to the present embodiment may include a passivation layer 20, a second intrinsic semiconductor layer 14, a second semiconductor layer 15, a third intrinsic semiconductor layer 16, and a third semiconductor layer 17 on a back surface of the semiconductor substrate 10.

The passivation layer 20 may be formed of or include a non-photo-conductive material (e.g., without photoconductive characteristics) and may be on or filled between the second semiconductor layer 15 and the third semiconductor layer 17 to insulate two semiconductor layers 15 and 17 from each other. For example, the passivation layer 20 may be formed prior to forming the second semiconductor layer 15 and the third semiconductor layer 17, and a portion of the second semiconductor layer 15 and the third semiconductor layer 17 may protrude on the passivation layer 20.

The passivation layer 20 may be formed on the back surface of the semiconductor substrate 10 at a predetermined thickness and may include a plurality of opening parts 21 spaced apart from each other. During preparation of the solar cell 100, a portion of the back surface of the semiconductor substrate 10 may be exposed by the opening part 21. The passivation layer 20 may include a stacked layer structure of a fourth intrinsic semiconductor layer 22 and a silicon nitride layer 23 and may be provided with the plurality of opening parts 21 formed by, e.g., wet etching using an etchant or partial etching using etching paste.

The passivation layer 20 (including the stacked layer structure of the fourth intrinsic semiconductor layer 22 and the silicon nitride layer 23) may have a double layer structure to help implement an excellent field passivation effect, thereby increasing the opening voltage of the solar cell 10. The field passivation effect may form an electric field on the surface of the semiconductor substrate 10 to help reduce and/or prevent surface movement of charges, thereby reducing the recombination of charges.

The second intrinsic semiconductor layer 14 may contact the back surface of the semiconductor substrate 10, a sidewall of the opening part 21, and a part of a back surface of the passivation layer 20 in any one of the plurality of opening parts 21.

An edge of the second intrinsic semiconductor layer 14 may protrude on the passivation layer 20. The second intrinsic semiconductor layer 14 may include amorphous silicon in which impurities are not intentionally doped.

The second semiconductor layer 15 (having a second conductive type opposite to the semiconductor substrate 10) may be disposed on a back surface of the second intrinsic semiconductor layer 14. The second semiconductor layer 15 may include p-type amorphous silicon. The second semiconductor layer 15 may have the same size as the second intrinsic semiconductor layer 14, and an edge thereof may protrude on the passivation layer 20.

The third intrinsic semiconductor layer 16 may contact the back surface of the semiconductor substrate 10, the side wall of the opening part 21, and a part of the back surface of the passivation layer 20 in another one of the plurality of opening parts 21. An edge of the third intrinsic semiconductor layer 16 may protrude on the passivation layer 20. The third intrinsic semiconductor layer 16 may include amorphous silicon in which impurities are not intentionally doped.

The third semiconductor layer 17 (having a first conductive type opposite to the semiconductor substrate 10) may be disposed on a back surface of the third intrinsic semiconductor layer 16. The third semiconductor layer 17 may include n-type amorphous silicon. The third semiconductor layer 17 may have the same size as the third intrinsic semiconductor layer 16, and an edge thereof may protrude on the passivation layer 20.

The second intrinsic semiconductor layer 14 and the third intrinsic semiconductor layer 16 may be spaced apart from each other on or above the passivation layer 20. The second semiconductor layer 15 and the third semiconductor layer 17 may also be spaced apart from each other to prevent a short-circuit therebetween. A first electrode 18 (including a transparent electrode layer 181 and a metal electrode layer 182) may be disposed on or above the second semiconductor layer 15. A second electrode 19 (including a transparent electrode layer 191 and a metal electrode layer 192) may be disposed on or above the third semiconductor layer 17.

The transparent electrode layers 181 and 191 may include a transparent metal oxide, e.g., indium tin oxide, tin oxide ($SnO_2$), zinc oxide (ZnO), or the like, or an alloy thereof. The metal electrode layers 182 and 192 may include, e.g., aluminum (Al), silver (Ag), copper (Cu), or the like. The plurality of first electrodes 18 may be connected to one another at an end of the semiconductor substrate 10, and the plurality of second electrodes 19 may be connected to one another at the end of the semiconductor substrate 10.

The second intrinsic semiconductor layer 14, the second semiconductor layer 15, and the first electrode 18 may form a cathode 30. The third intrinsic semiconductor layer 16, the third semiconductor layer 17, and the second electrode 19 may form an anode 40. The second semiconductor layer 15 may form a p-n junction with the semiconductor substrate 10. The third semiconductor layer 17 may serve as a back surface field layer that forms an internal electric field to increase an electron collection effect.

In the aforementioned solar cell 100, three intrinsic semiconductor layers (the second intrinsic semiconductor layer 14, the third intrinsic semiconductor layer 16, and the fourth intrinsic semiconductor layer 22) may be disposed on the back surface of the semiconductor substrate 10. The intrinsic semiconductor layers may have insulation properties, but the second intrinsic semiconductor layer 14 and the third intrinsic semiconductor layer 16 may have an extremely thin thickness, such that current may flow along the thickness direction by the electric field of the second semiconductor layer 15 and the third semiconductor layer 17.

For example, in the solar cell 100, the electric field may be generated only in the thickness direction of the semiconductor substrate 10 (e.g., a vertical direction in FIG. 1), and may not be generated in a surface direction of the semiconductor substrate 10 (e.g., a horizontal direction in FIG. 1). Therefore, the fourth intrinsic semiconductor layer 22 may maintain the insulating state to thereby function as part of the passivation layer 20.

In manufacturing of the solar cell 100 (described in greater detail below), the second intrinsic semiconductor layer 14 and the third intrinsic semiconductor layer 16 may have characteristics discontinuously contacting the interface of the fourth intrinsic semiconductor layer 22, such that a short-circuit of the cathode 30 and the anode 40 may not occur via the fourth intrinsic semiconductor layer 22.

When light, e.g., sunlight, is incident on the solar cell 100, electrons having (−) charges and holes having (+) charges may be generated on the semiconductor substrate 10. The holes may be transferred to the first electrode 18 via the second semiconductor layer 15, and the electrons may be transferred to the second electrode 19 via the third semiconductor layer 17. The first electrode 18 and the second electrode 19 may be connected to loads (external devices) to supply power generated in the solar cell 100 to the loads.

The solar cell 100 may have a heterojunction with intrinsic thin-layer (HIT) structure in which the second intrinsic semiconductor layer 14 is disposed between the semiconductor substrate 10 and the second semiconductor layer 15. The second intrinsic semiconductor layer 14 may help improve the p-n junction characteristics. The third intrinsic semiconductor layer 16 (disposed between the semiconductor substrate 10 and the third semiconductor layer 17) may also help suppress the recombination of carriers to improve photoelectric conversion efficiency of the solar cell 100.

In the solar cell 100 according to the present embodiment, the back surface of the semiconductor substrate 10 may be covered with the passivation layer 20 (including the stacked layer of the fourth intrinsic semiconductor layer 22 and the silicon nitride layer 23) and may have the structure in which the cathode 30 and the anode 40 are each stacked on or above the opening part 21 and the passivation layer 20. The passivation layer 20 may help improve passivation characteristics between the second semiconductor layer 15 and the third semiconductor layer 17 to thereby increase the opening voltage and reduce shunting resistance between the second semiconductor layer 15 and the third semiconductor layer 17.

In the solar cell 100 according to the present embodiment, all of the layers of the cathode 30 and the anode 40 may be patterned by a process using an etching resist and wet etching or a process using an etching paste, rather than a deposition method using a depositing mask or a lift-off process. Therefore, it is possible to reduce manufacturing costs and facilitate mass production by simplifying the manufacturing process of the cathode 30 and the anode 40. A method for manufacturing the solar cell 100 will be described in greater detail below.

The back surface of the semiconductor substrate 10 (contacting the third intrinsic semiconductor layer 16) may be provided with a fourth semiconductor layer 51 having the same conductive type as the semiconductor substrate 10. The fourth semiconductor layer 51 may include a high concentration n-type doping region (n+ diffusion layer) into which impurities having higher concentration than that of the semiconductor substrate 10 and the third semiconductor layer 17 are implanted. A width of the fourth semiconductor layer 51 may be about the same as a width of the third semiconductor layer 17.

The fourth semiconductor layer 51 may help maximize the back surface field effect of the third semiconductor layer 17 to thereby increase a hole collection effect of the second semiconductor layer 15 and an electron collection effect of the third semiconductor layer 17. As a result, photoelectric conversion efficiency may be improved by increasing the opening voltage of the solar cell 100. If desired, the fourth semiconductor layer 51 may be omitted.

The back surface of the semiconductor substrate 10 may be flatly formed or may have a surface textured structure similarly to the light receiving surface. Back surface texturing of the semiconductor substrate 10 may help induce internal reflection to lengthen a passage of incident light, thereby increasing the likelihood that light will be re-absorbed in the semiconductor substrate 10.

Figure 3:
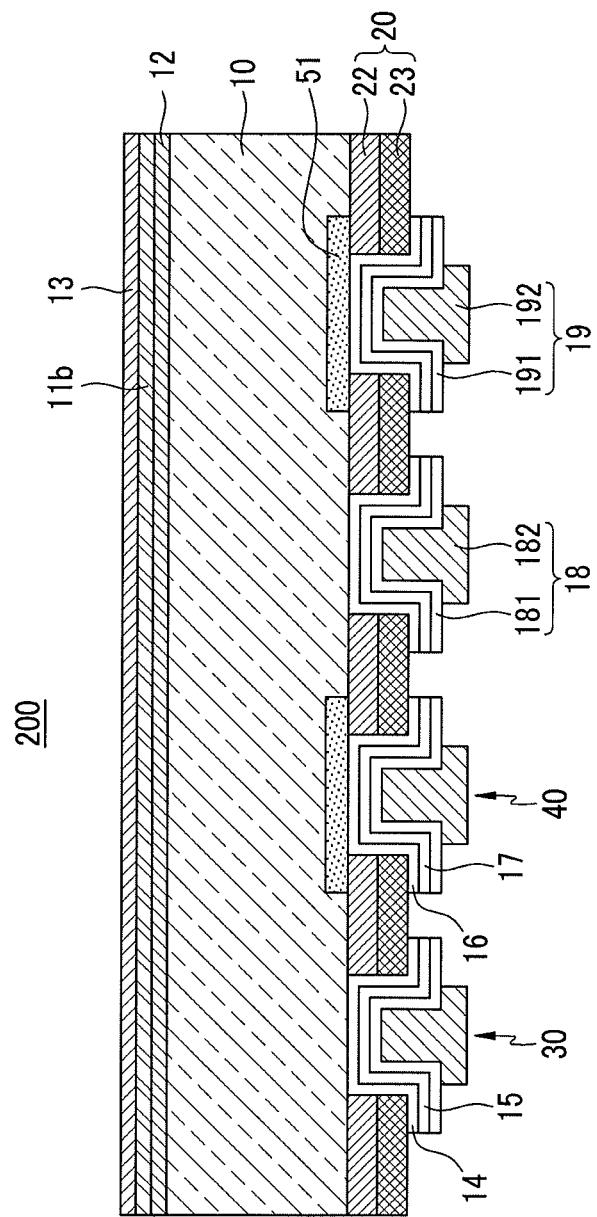
FIG. 3 illustrates a schematic diagram of a solar cell according to another embodiment.

FIG. 3 illustrates a schematic diagram of a solar cell according to another embodiment.

Referring to FIG. 3, a solar cell 200 according to the present embodiment may have the same configuration as the previous embodiment, except that a first semiconductor layer 11b may include n-type amorphous silicon and may be disposed between a first intrinsic semiconductor layer 12 and an anti-reflective layer 13. The same members as the previous embodiment are denoted by the same reference numerals.

The first semiconductor layer 11b may be disposed on a front surface of the first intrinsic semiconductor layer 12 and may contact the anti-reflective layer 13. Functions of the first semiconductor layer 11b and the first intrinsic semiconductor layer 12 may be the same as the previous embodiment. For example, the first semiconductor layer 11b may serve as the front surface electric field layer to help reduce recombination of charges generated on the surface of the semiconductor substrate 10, thereby increasing the opening voltage of the solar cell 200 together with the action of the surface defect passivation of the first intrinsic semiconductor layer 12.

Figure 4:
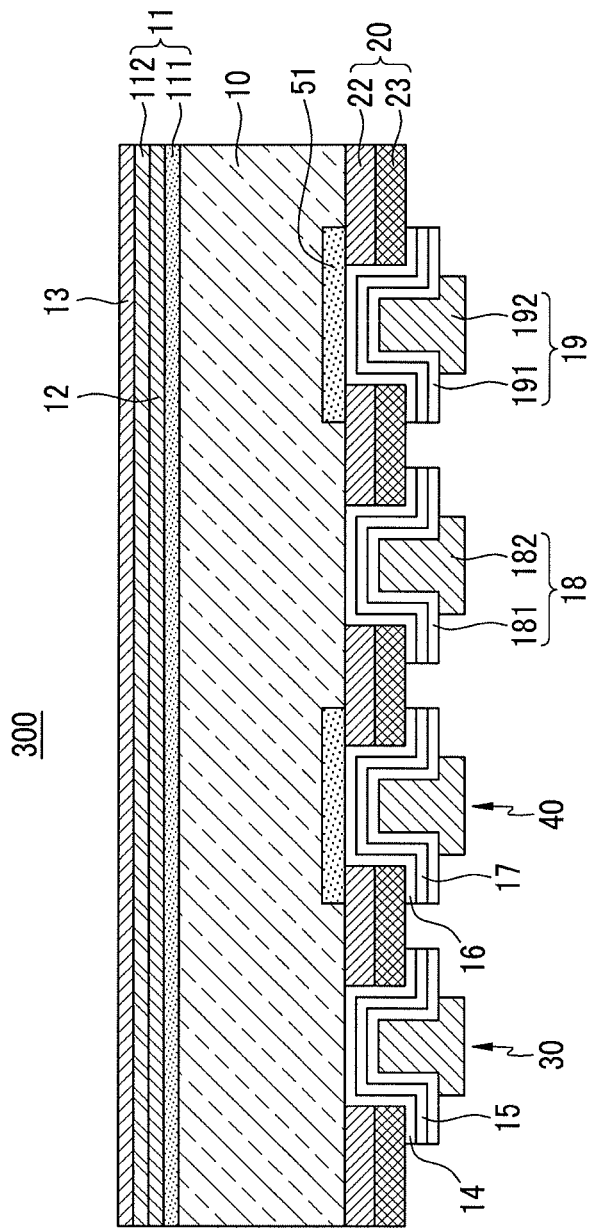
FIG. 4 illustrates a schematic diagram of a solar cell according to yet another embodiment.

FIG. 4 illustrates a schematic diagram of a solar cell according to yet another embodiment.

Referring to FIG. 4, a solar cell 300 according to the present embodiment has the same structure as the solar cell according to the previous embodiments except that a first semiconductor layer 11 includes a first layer 111 on a back surface of a first intrinsic semiconductor layer 12 and a second layer 112 on a front surface of the first intrinsic semiconductor layer 12. The same elements as the previous embodiments are denoted by the same reference numerals.

The first layer 111 may include a high concentration n-type doping region (n+ diffusion layer) and may be between the semiconductor substrate 10 and the first intrinsic semiconductor layer 12. The second layer 112 may include an n-type amorphous silicon layer and may be between the first intrinsic semiconductor layer 12 and the anti-reflective layer 13.

In the present embodiment, the first semiconductor layer 11 (serving as a front surface electric field layer) may have a double-layered structure of the first layer 111 and the second layer 112. Thus, the front surface field effect that increases the recombination of charges may be maximized, such that the opening voltage of the solar cell 300 may be more effectively improved.

Figure 5:
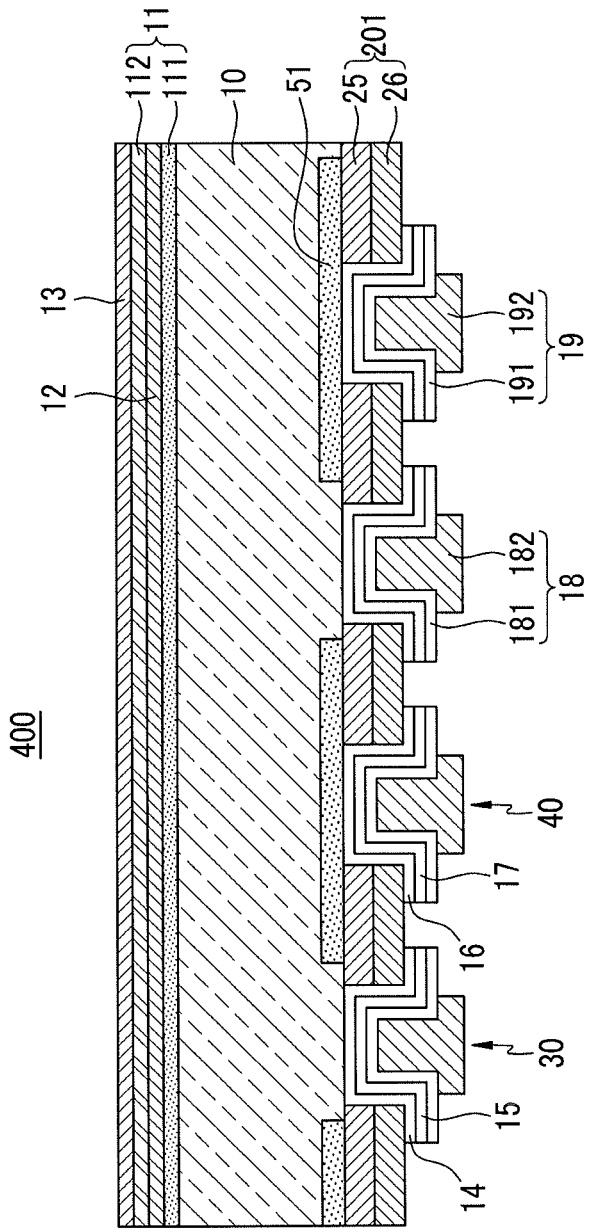
FIG. 5 illustrates a schematic diagram of a solar cell according to still another embodiment.

FIG. 5 illustrates a schematic diagram of a solar cell according to still another embodiment.

Referring to FIG. 5, a solar cell 400 according to the present embodiment has the same configuration as the solar cell according to any one of the previous embodiments except that a passivation layer 201 includes a stacked layer of a silicon oxide layer 25 and a silicon nitride layer 26, and a width of a fourth semiconductor layer 51 is expanded. FIG. 4 shows a basic configuration of the solar cell according to the previous embodiment, and the same elements as the previous embodiment are denoted by the same reference numerals.

The passivation layer 201 (including the stacked layer of the silicon oxide layer 25 and the silicon nitride layer 26) may have a double layer structure similar to the previous embodiment to help implement the excellent field passivation effect, thereby increasing the opening voltage of the solar cell 100.

The fourth semiconductor layer 51 may be formed on the third intrinsic semiconductor layer 16 and the passivation layer 201, e.g., on the back surface of the semiconductor substrate 10 contacting the silicon oxide layer 25. The fourth semiconductor layer 51 may be spaced apart from the second intrinsic semiconductor layer 14 so as not to be short-circuited with the cathode 30. Thus, the field passivation effect of the passivation layer 201 may be increased due to the back surface field effect of the fourth semiconductor layer 51.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

The following Table 1 shows the opening voltage Voc that was measured in the solar cell of a Comparative Example and of Examples 1-3, e.g., a solar cell of the first above-described embodiment, a solar cell of the second above-described embodiment, and a solar cell of the third above-described embodiment.

TABLE 1

| Comparative Example | Example 1 | Example 2 | Example 3 |
|---|---|---|---|
| 691 mV | 700 mV | 721 mV | 722 mV |

In the solar cell of the Comparative Example, the first intrinsic semiconductor layer and the anti-reflective layer were disposed on the light receiving surface of the semiconductor substrate. In the solar cell of the Comparative Example and the solar cell of Examples 1-3, the first intrinsic semiconductor layer and the anti-reflective layer included the same component and were formed at the same thickness.

As may be seen in Table 1, all of the solar cells of Examples 1-3 exhibited higher opening voltages than that of the solar cell of the Comparative Example. For example, it may be seen the solar cell of Example 3 (in which the first semiconductor layer was disposed on both surfaces of the first intrinsic semiconductor layer) exhibited the highest opening voltage.

FIGS. 6A to 6E illustrate schematic diagrams showing stages in a manufacturing process of the solar cell according to an embodiment.

Referring to FIG. 6A, a semiconductor substrate 10 (formed of a n-type silicon wafer) may be prepared, and a first layer 111 of a first semiconductor layer 11, a first intrinsic semiconductor layer 12, a second layer 112 of the first semiconductor layer 11, and an anti-reflective layer 13 may be sequentially formed on a front surface (light receiving surface) of the semiconductor substrate 10. In an implementation, the front surface of the semiconductor substrate 10 may be subjected to a surface texturing treatment.

The first layer 111 may be formed by implanting n-type impurities into the front surface of the semiconductor substrate 10 at a high concentration. The first intrinsic semiconductor layer 12 may be formed of amorphous silicon, and the second layer 112 may be formed of n-type amorphous silicon. The anti-reflective layer 13 may be formed as a single layer or as a multilayer layer, and may include, e.g., a metal oxide, a metal nitride, a metal sulfide, and/or a metal fluoride. In an implementation, any one of the first layer 111 and the second layer 112 may be selectively omitted.

The n-type impurities may be implanted into a portion of the back surface of the semiconductor substrate 10 at a high concentration to form the fourth semiconductor layer 51.

Referring to FIG. 6B, a passivation layer 20 may be formed by sequentially stacking a fourth intrinsic semiconductor layer 22 and a silicon nitride layer 23 on a back surface of the semiconductor substrate 10. In an implementation, a silicon oxide layer may be formed instead of the fourth intrinsic semiconductor layer 22. Thus, the passivation layer 20 may include the stacked layer of the silicon oxide layer and the silicon nitride layer.

Then, an etching resist may be applied to a back surface of the passivation layer 20, and the passivation layer 20 may then be subjected to wet etching. Alternatively, the passivation layer 20 may be patterned by printing an etching paste 55 onto the back surface of the passivation layer 20. The etching paste 55 may be printed and dried for about 30 minutes or less at about 100 to about 300° C. During the drying process, the material to be etched may be etched. The etching resist may be formed at a portion that is not to be etched, unlike the etching paste 55. Thus, a plurality of opening parts 21 may be formed in the passivation layer 20 through the above-described patterning processes.

Figure 6C:
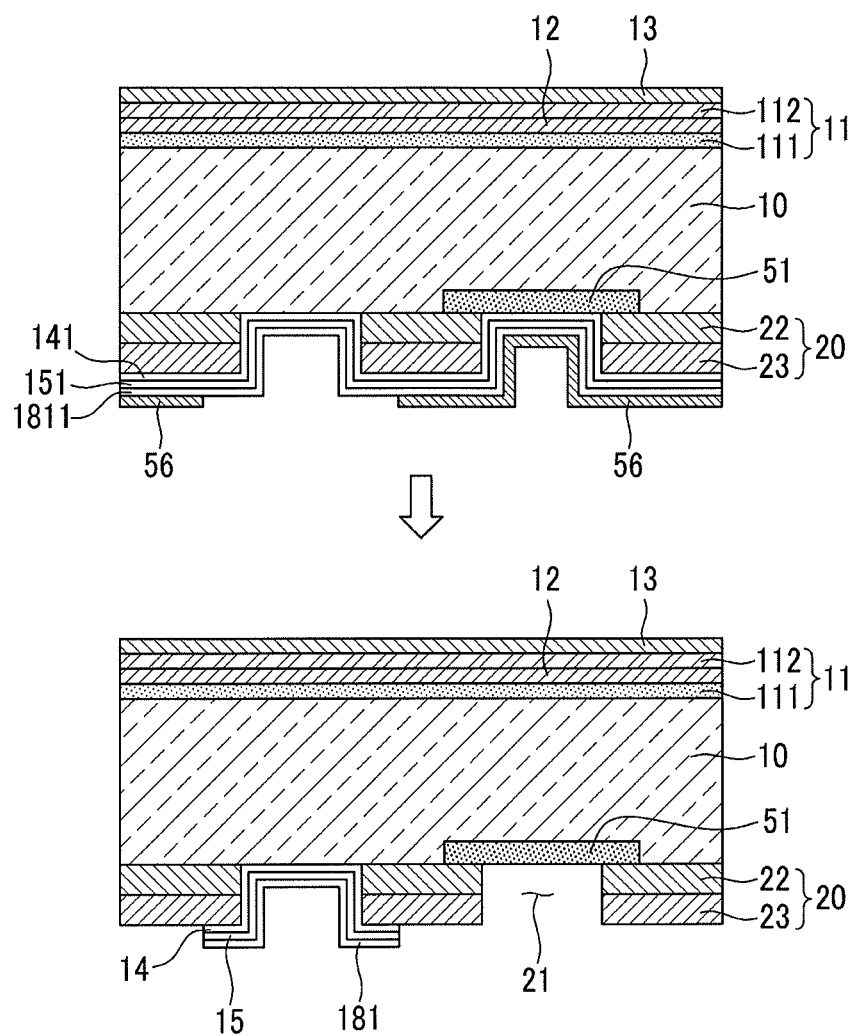

Referring to FIG. 6C, an intrinsic semiconductor layer 141, a p-type amorphous silicon layer 151, and a transparent electrode layer 1811 may be sequentially formed over the back surface of the semiconductor substrate 10. Portions of the intrinsic semiconductor layer 141, the p-type amorphous silicon layer 151, and the transparent electrode 1811 may be patterned together by forming an etching resist thereon and then wet etching or, alternatively, by printing an etching paste 56 thereon. Thus, a second intrinsic semiconductor layer 14, a second semiconductor layer 15, and a transparent electrode layer 181 of a first electrode may be simultaneously formed.

The second intrinsic semiconductor layer 14 may be formed so as to contact the back surface of the semiconductor substrate 10, a side wall of the opening part 21, and a back surface of the passivation layer 20 in any one of the plurality of opening parts 21. The second semiconductor layer 15 and the transparent electrode layer 181 may be formed to have the same size as the second intrinsic semiconductor layer 14.

Figure 6D:
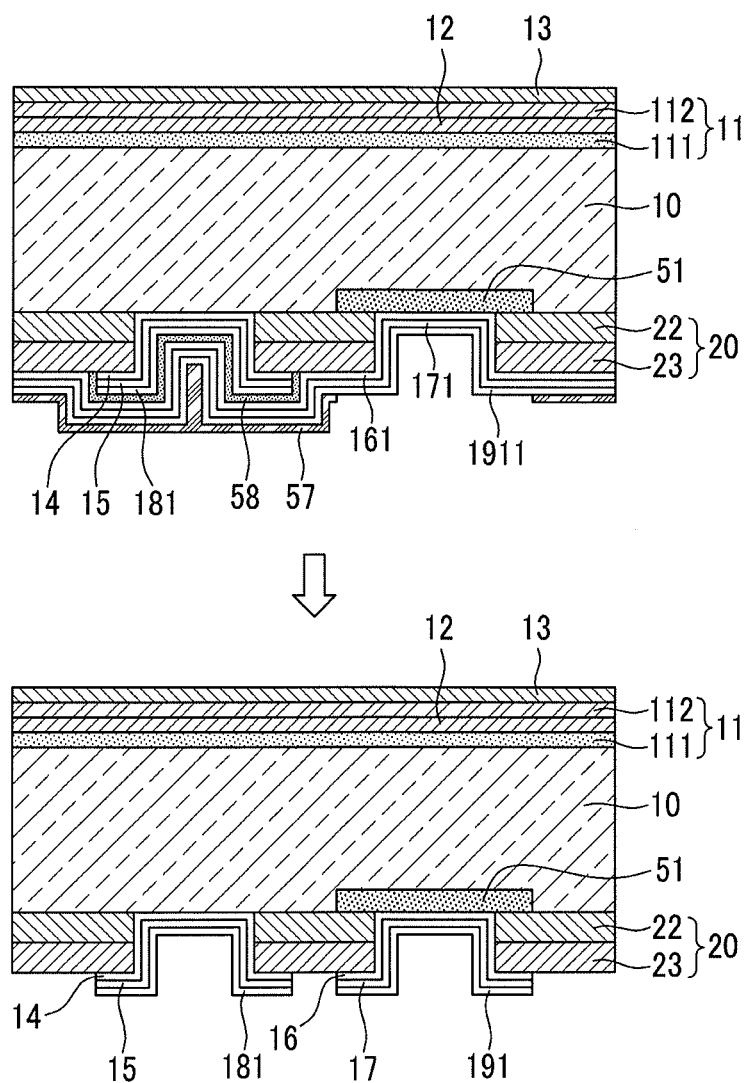

Referring to FIG. 6D, an intrinsic semiconductor layer 161, a n-type amorphous silicon layer 171, and a transparent electrode layer 1911 may be sequentially formed on the back surface of the semiconductor substrate 10. The intrinsic semiconductor layer 161, the n-type amorphous silicon layer 171, and the transparent electrode 1911 may be patterned together by forming an etching resist and then wet etching or, alternatively, by printing an etching paste 57 thereon. Thus, a third intrinsic semiconductor layer 16, a third semiconductor layer 17, and a transparent electrode layer 191 of a second electrode may be simultaneously formed.

In an implementation, a protective layer 58 may be formed on the transparent electrode layer 181 of the first electrode so that the earlier formed second intrinsic semiconductor layer 14, the second semiconductor layer 15, and the transparent electrode layer 181 of the first electrode are not etched by the etching paste 57. The protective layer 58 may be removed after patterning the third intrinsic semiconductor layer 16, the third semiconductor layer 17, and the transparent electrode layer 191 of the second electrode.

The third intrinsic semiconductor layer 16 may be formed so as to contact the back surface of the semiconductor substrate 10, the side wall of the opening part 21, and the back surface of the passivation layer 20 in the other one of the plurality of opening parts 21, and may be spaced apart from the second intrinsic semiconductor layer 14. The third semiconductor layer 17 and the transparent electrode layer 191 may have the same size as the third intrinsic semiconductor layer 16.

Figure 6E:
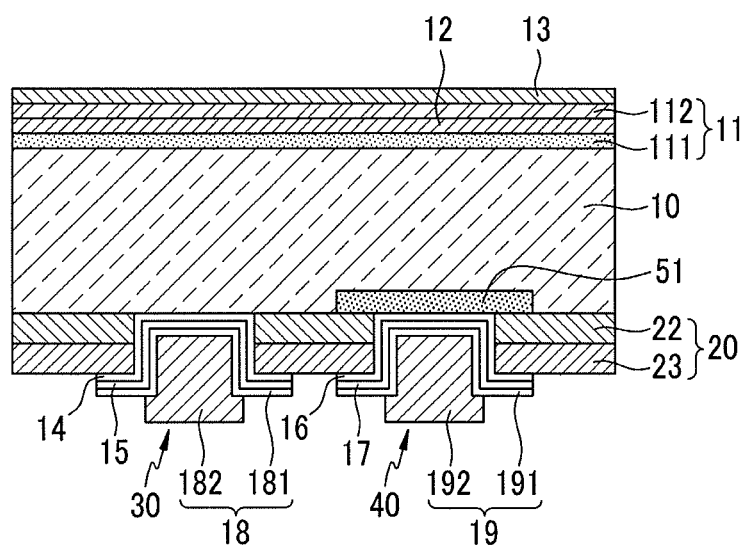

Referring to FIG. 6E, a metal electrode layer 182 (of the first electrode 18) and a metal electrode layer 192 (of the second electrode 19) may be simultaneously formed on the back surface of the semiconductor substrate 10 by a printing method, e.g., screen printing, gravure printing, offset printing, or inkjet printing. The solar cell is completed by the above-mentioned processes.

In the solar cell according to an embodiment, the layers forming the passivation layer 20, the cathode 30, an/or the anode 40 may be partially patterned by the etching methods using wet etching and an etching resist or, alternatively, an etching method using an etching paste. Metal electrode layers 182 and 192 may be formed by the printing method. Therefore, the embodiments may help simplify the manufacturing process and may help reduce the manufacturing costs, thereby facilitating mass production.

By way of summation and review, in order to increase photoelectric conversion efficiency of a solar cell, an increase of short current, opening voltage, and fill factor is desirable. For example, an increase in the opening voltage by improving a light receiving surface structure and a back passivation structure is desirable. In addition, when patterning electrodes for collecting electrons and holes, several deposition masks may be used or a lift-off process may be required. Such processes should be replaced with other processes that help reduce manufacturing costs and/or facilitate mass production.

The embodiments provide a solar cell having improved photoelectric conversion efficiency by increasing opening voltage, being prepared by a simplified process, and having reduced manufacturing costs.

According to the embodiments, it is possible to increase the opening voltage of the solar cell by improving passivation characteristics of the light receiving surface (to which light is incident) and passivation characteristics between the second semiconductor layer and the third semiconductor layer on the back surface of the semiconductor substrate. In addition, according to the embodiments, it is possible to increase hole collection efficiency and electron collection efficiency by maximizing a back field effect and to facilitate mass production by simplifying a manufacturing process. The embodiments provide a heterojunction back contact solar cell.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A solar cell, comprising:
a first conductive type semiconductor substrate;
a first intrinsic semiconductor layer on a front surface of the semiconductor substrate;
a first conductive type first semiconductor layer on at least one surface of the first intrinsic semiconductor layer;
a multi-layered passivation layer on a back surface of the semiconductor substrate having a first opening to the back surface of the semiconductor substrate and a second opening to the back surface of the semiconductor substrate, wherein the back surface of the semiconductor substrate is substantially planar;
a second conductive type second semiconductor layer over the semiconductor substrate inside the first opening and over a side wall of the first opening;
a second intrinsic semiconductor layer on the semiconductor substrate inside the first opening between the second semiconductor layer and the semiconductor substrate and on the side wall of the first opening between the second semiconductor layer and the multi-layered passivation layer;
a first conductive type third semiconductor layer over the semiconductor substrate inside the second opening and over a side wall of the second opening, wherein the third semiconductor layer is spaced apart from the second semiconductor layer; and
a third intrinsic semiconductor layer on the semiconductor substrate inside the second opening between the third semiconductor layer and the semiconductor substrate and on the side wall of the second opening between the third semiconductor layer and the multi-layered passivation layer.

2. The solar cell as claimed in claim 1, wherein the first semiconductor layer includes a high concentration doping region between the semiconductor substrate and the first intrinsic semiconductor layer.

3. The sour cell as claimed in claim 1, wherein the first conductive type first semiconductor layer includes an amorphous silicon layer on a front surface of the first intrinsic semiconductor layer.

4. The solar cell as claimed in claim 1, wherein the first conductive type first semiconductor layer includes:
a first layer between the semiconductor substrate and the first intrinsic semiconductor layer, the first layer including a high concentration doping region, and
a second layer on a front surface of the first intrinsic semiconductor layer, the second layer including an amorphous silicon layer.

5. The solar cell as claimed in claim 1, further comprising an anti-reflective layer on the front surface of the semiconductor substrate, the front surface of the semiconductor substrate having a surface textured structure.

6. A solar comprising:
a first conductive type semiconductor substrate;
a first intrinsic semiconductor layer on a front surface of the semiconductor substrate;
a passivation layer on a back surface of the semiconductor substrate, the passivation layer including a plurality of opening parts to the back surface of the semiconductor substrate, wherein the back surface of the semiconductor substrate is substantially planar, wherein the plurality of opening parts comprises a first opening and a second opening, and wherein the passivation layer has a multi-layered structure of a substantially non-photo-conductive material;
a second intrinsic semiconductor layer on the semiconductor substrate inside the first opening, on a side wall of the first opening, and on a back surface of the passivation layer next to the first opening;
a second conductive type second semiconductor layer on a back surface of the second intrinsic semiconductor layer over the semiconductor substrate in the first opening, over the side wall of the first opening, and over the back surface of the passivation layer next to the first opening;
a third intrinsic semiconductor layer on the semiconductor substrate inside the second opening, on a side wall of the second opening, and on the back surface of the passivation layer next to the second opening, wherein the third intrinsic semiconductor layer is spaced apart from the second intrinsic semiconductor layer; and
a first conductive type third semiconductor layer on a back surface of the third intrinsic semiconductor layer over the semiconductor substrate in the second opening, over the side wall of the second opening, and over the back surface of the passivation layer next to the second opening.

7. The solar cell as claimed in claim 6, wherein the passivation layer has a stacked structure including a fourth intrinsic semiconductor layer and a silicon nitride layer.

8. The solar cell as claimed in claim 7, further comprising a fourth semiconductor layer on the back surface of the semiconductor substrate, the fourth semiconductor layer contacting the third intrinsic semiconductor layer and including a first conductive type doping region doped at a higher concentration than the semiconductor substrate.

9. The solar cell as claimed in claim 6, wherein the passivation layer has a stacked layer structure including a silicon oxide layer and a silicon nitride layer.

10. The solar cell as claimed in claim 9, further comprising a fourth semiconductor layer spaced apart from the second intrinsic semiconductor layer on the back surface of the semiconductor substrate, the fourth semiconductor layer contacting the third intrinsic semiconductor layer and the silicon oxide layer and including a first conductive type doping region doped at a higher concentration than the semiconductor substrate.

11. The solar cell as claimed in claim 6, wherein:
the second semiconductor layer is approximately the same size as the second intrinsic semiconductor layer, and
the third semiconductor layer is approximately the same size as the third intrinsic semiconductor layer.

12. The solar cell as claimed in claim 11, further comprising:
a first electrode on a back surface of the second semiconductor layer, and
a second electrode on a back surface of the third semiconductor layer,
wherein the first electrode and the second electrode each have a stacked layer structure including a transparent electrode layer and a metal electrode layer.

13. The solar cell as claimed in claim 6, further comprising an anti-reflective layer on a front surface of the first intrinsic semiconductor layer, the front surface of the semiconductor substrate having a surface textured structure.

14. A solar cell, comprising:
a first conductive type semiconductor substrate;
a first intrinsic semiconductor layer on a front surface of the semiconductor substrate;
a first conductive type first semiconductor layer on at least one surface of the first intrinsic semiconductor layer;
a passivation layer on a back surface of the semiconductor substrate, the passivation layer including a plurality of opening parts to the back surface semiconductor substrate, wherein the back surface of the semiconductor substrate is substantially planar, wherein the plurality of opening parts comprises a first opening and a second opening, wherein the passivation layer has a multi-layered structure, and wherein the passivation layer comprises substantially non-photo-conductive material;
a second intrinsic semiconductor layer on the semiconductor substrate inside the first opening, on a side wall of the first opening and on a back surface of the passivation layer next to the first opening;
a second conductive type second semiconductor layer on a back surface of the second intrinsic semiconductor layer over the semiconductor substrate in the first opening, over the side wall of the first opening, and over the back surface of the passivation layer next to the first opening;
a third intrinsic semiconductor on the semiconductor substrate inside the second opening, on a side wall of the second opening, and on the back surface of the passivation layer next to the second opening, wherein the third intrinsic semiconductor layer is spaced apart from the second intrinsic semiconductor layer; and
a first conductive type third semiconductor layer on a back surface of the third intrinsic semiconductor layer over the semiconductor substrate in the second opening, over the side wall of the second opening, and over the back surface of the passivation layer next to the second opening.

15. The solar cell as claimed in claim 14, wherein the first conductive type first semiconductor layer includes at least one of:
a first layer on a back surface of the first intrinsic semiconductor layer, the first layer including a high concentration doping region, and
a second layer on a front surface of the first intrinsic semiconductor layer, the coed layer including an amorphous silicon layer.

16. The solar cell as claimed in claim 15, further comprising an anti-reflective layer on the front surface of the semiconductor substrate, the front surface of the semiconductor substrate having a surface textured structure.

17. The solar cell as claimed in claim 14, wherein the passivation layer includes any one of:
a stacked layer structure of a fourth intrinsic semiconductor layer and a silicon nitride layer, and
a stacked layer structure of a silicon oxide layer and a silicon nitride layer.

18. The solar cell as claimed in claim 14, further comprising a fourth semiconductor layer on the back surface of the semiconductor substrate, the fourth semiconductor layer contacting the third intrinsic semiconductor layer and including a first conductive type doping region doped at a higher concentration than the semiconductor substrate.

19. The solar cell as claimed in claim 18, wherein the fourth semiconductor layer extends on the back surface of the semiconductor substrate, contacts the passivation layer, and is spaced apart from the second intrinsic semiconductor layer.

20. The solar cell as claimed in claim 14, further comprising:
a first electrode on the back surface of the second semiconductor layer; and
a second electrode on the back surface of the third semiconductor layer,
wherein the first electrode and the second electrode each have a stacked layer structure including a transparent electrode layer and a metal electrode layer.

* * * * *